United States Patent
Chang et al.

(10) Patent No.: US 10,090,061 B2
(45) Date of Patent: Oct. 2, 2018

(54) MEMORY TEST DATA GENERATING CIRCUIT AND METHOD

(71) Applicant: MStar Semiconductor, Inc., Hsinchu Hsien (TW)

(72) Inventors: Qi-Xin Chang, Zhubei (TW); Chen-Nan Lin, Zhubei (TW); Chung-Ching Chen, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 78 days.

(21) Appl. No.: 15/138,456

(22) Filed: Apr. 26, 2016

(65) Prior Publication Data
US 2016/0322117 A1    Nov. 3, 2016

(30) Foreign Application Priority Data

Apr. 28, 2015   (TW) .............................. 104113505 A (51) Int. Cl.
*H03M 13/03* (2006.01)
*G11C 29/38* (2006.01)
*G11C 29/36* (2006.01)

(52) U.S. Cl.
CPC .............. *G11C 29/38* (2013.01); *G11C 29/36* (2013.01); *G11C 2029/3602* (2013.01)

(58) Field of Classification Search
CPC .. G11C 29/38; G11C 29/36; G11C 2029/3602
See application file for complete search history.

(56) References Cited

U.S. PATENT DOCUMENTS

| | | | | |
|---|---|---|---|---|
| 5,357,523 A | * | 10/1994 | Bogholtz, Jr. ... | G01R 31/31813 365/201 |
| 5,872,797 A | * | 2/1999 | Theodoseau ..... | G01R 31/31813 711/217 |
| 6,718,487 B1 | * | 4/2004 | Sommer .......... | G11C 29/12015 714/42 |

\* cited by examiner

*Primary Examiner* — Sam Rizk
(74) *Attorney, Agent, or Firm* — Edell, Shapiro & Finnan, LLC (57) ABSTRACT

A memory test data generating circuit and method for generating a plurality of sets of test data is provided. The plurality of sets of test data is provided to a memory via a plurality of channels by a memory controller and is for testing the memory. The memory test data generating circuit includes: a plurality of counters, generating a plurality of counter values; and a data repetition and combination unit, generating the plurality of sets of test data according to the plurality of counter values, a bit width between the memory test data generating circuit and the memory controller, and a bit width between the memory controller and the memory. The test data of each channel is an identical and periodical data series.

18 Claims, 9 Drawing Sheets

|  | $T_0$ | $T_1$ | $T_2$ | $T_3$ |
|---|---|---|---|---|
| channel 1 | $D_0$ | $D_1$ | $D_2$ | $D_3$ |
| channel 2 | $D_1$ | $D_2$ | $D_3$ | $D_4$ |
| channel 3 | $D_2$ | $D_3$ | $D_4$ | $D_5$ |
| channel 4 | $D_3$ | $D_4$ | $D_5$ | $D_6$ |

⋮

|  | $T_{x-1}$ | $T_x$ | $T_{x+1}$ |
|---|---|---|---|
| channel 1 | $D_{x-1}$ | $D_x$ | $D_0$ |
| channel 2 | $D_x$ | $D_0$ | $D_1$ |
| channel 3 | $D_0$ | $D_1$ | $D_2$ |
| channel 4 | $D_1$ | $D_2$ | $D_3$ |

|  | T0 | T1 | T2 | T3 | T4 | T5 | T6 | T7 | T8 | T9 | T10 | T11 | T12 | T13 | T14 | T15 | T16 | T17 | T18 | T19 | T20 | T21 | T22 | T23 | T24 | T25 | T26 | T27 | T28 | T29 | T30 | T31 |
|---|---|---|---|---|---|---|---|---|---|---|---|---|---|---|---|---|---|---|---|---|---|---|---|---|---|---|---|---|---|---|---|---|
| channel 1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| channel 2 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
| channel 3 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
| channel 4 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |

FIG. 6B

|  | T0 | T1 | T2 | T3 | T4 | T5 | T6 | T7 | T8 | T9 | T10 | T11 | T12 | T13 | T14 | T15 | T16 | T17 | T18 | T19 | T20 | T21 | T22 | T23 | T24 | T25 | T26 | T27 | T28 | T29 | T30 | T31 |
|---|---|---|---|---|---|---|---|---|---|---|---|---|---|---|---|---|---|---|---|---|---|---|---|---|---|---|---|---|---|---|---|---|
| channel 1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| channel 2 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |

| | T0 | T1 | T2 | T3 | T4 | T5 | T6 | T7 | T8 | T9 | T10 | T11 | T12 | T13 | T14 | T15 | T16 | T17 | T18 | T19 | T20 | T21 | T22 | T23 | T24 | T25 | T26 | T27 | T28 | T29 | T30 | T31 |
|---|---|---|---|---|---|---|---|---|---|---|---|---|---|---|---|---|---|---|---|---|---|---|---|---|---|---|---|---|---|---|---|---|
| channel 1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| channel 2 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
| channel 3 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
| channel 4 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |

FIG. 6C

| | T0 | T1 | T2 | T3 | T4 | T5 | T6 | T7 | T8 | T9 | T10 | T11 | T12 | T13 | T14 | T15 | T16 | T17 | T18 | T19 | T20 | T21 | T22 | T23 | T24 | T25 | T26 | T27 | T28 | T29 | T30 | T31 |
|---|---|---|---|---|---|---|---|---|---|---|---|---|---|---|---|---|---|---|---|---|---|---|---|---|---|---|---|---|---|---|---|---|
| channel 1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| channel 2 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |

FIG. 6D

| channel 1 | T0 | T1 | T2 | T3 | T4 | T5 | T6 | T7 | T8 | T9 | T10 | T11 | T12 | T13 | T14 | T15 | T16 | T17 | T18 | T19 | T20 | T21 | T22 | T23 | T24 | T25 | T26 | T27 | T28 | T29 | T30 | T31 |
|---|---|---|---|---|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |

MEMORY TEST DATA GENERATING CIRCUIT AND METHOD

This application claims the benefit of Taiwan application Serial No. 104113505, filed Apr. 28, 2015, the subject matter of which is incorporated herein by reference.

BACKGROUND OF THE INVENTION

Field of the Invention

The invention relates in general to a memory, and more particularly to reliability verification of a memory.

Description of the Related Art

Figure 1:
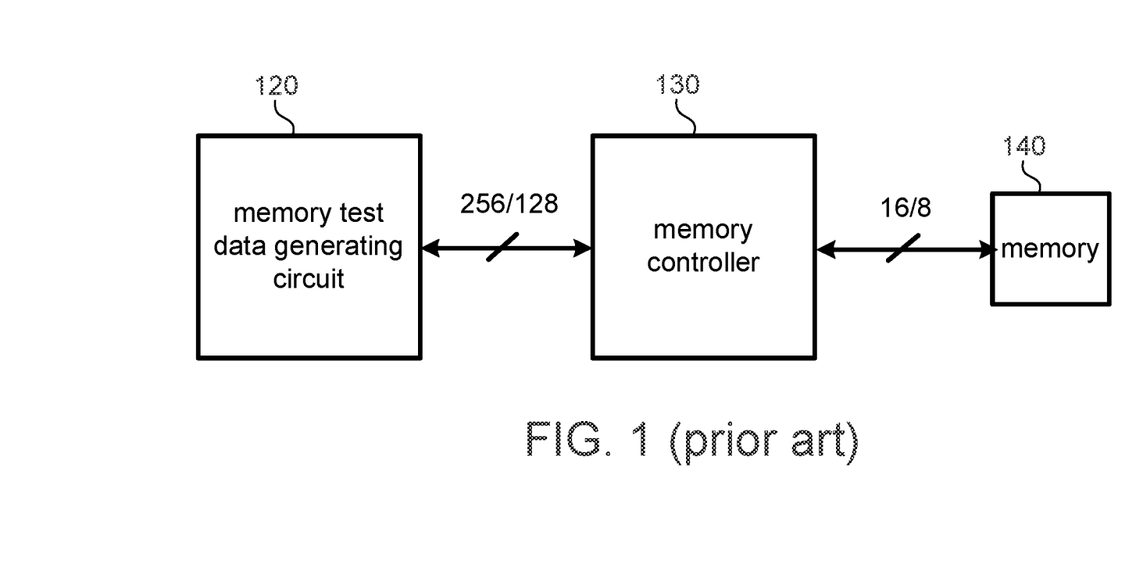
FIG. 1 is a function block diagram of a conventional memory test data generating circuit, a memory controller and a memory.

In an application system adopting a memory, e.g., a multimedia system, due to the existence of interference from power lines and/or signal lines, test and analysis for power integrity (PI) and/or signal integrity (SI) need to be performed on the memory to verify the reliability of the memory. The above memory includes a dynamic random access memory (DRAM) and a synchronous dynamic random access memory (SDRAM). For example, for PI, when signals convert fast, the system reliability may be affected by power due to fluctuations in the power supply or ground level caused by cavity characteristics formed by resistance, voltage plane and ground plane. On the other hand, for SI, the system reliability may be affected by coupling, serial interference and mutual interference among signal transmission lines. For example, assume that a signal of only one signal line of the transmission lines changes from a low level to a high level, and signals of other multiple signal lines change from a high level to a low level. For this particular signal line, due to coupling, serial interference and mutual interference effects of the other multiple signals, signal characteristics of the signal line changed to the high level may become less satisfactory, including a low change speed to the high level or a reduced target voltage at the high level, such that the system reliability is degraded. Through the foregoing PI and/or SI analysis, the reliability of the system operating at the worst scenario, i.e., the worst signal mode, may be simulated. FIG. 1 shows a function block diagram of a conventional test data generating circuit. A memory test data generating circuit 120 accesses a memory 140 via a memory controller 130. A data bus between the memory test data generating circuit 120 and the memory controller 130 may be 256-bit or 128-bit, and a data bus between the memory controller 130 and the memory 140 may be 16-bit or 8-bit. When the memory is analyzed, the memory test data generating circuit 120 sends predetermined test data and associated test control signals for simulating worst noise. Such test data is written in and read from the memory 140 through the control of the memory controller 130, and the read data is analyzed to verify the reliability of the memory 140.

Figure 2:
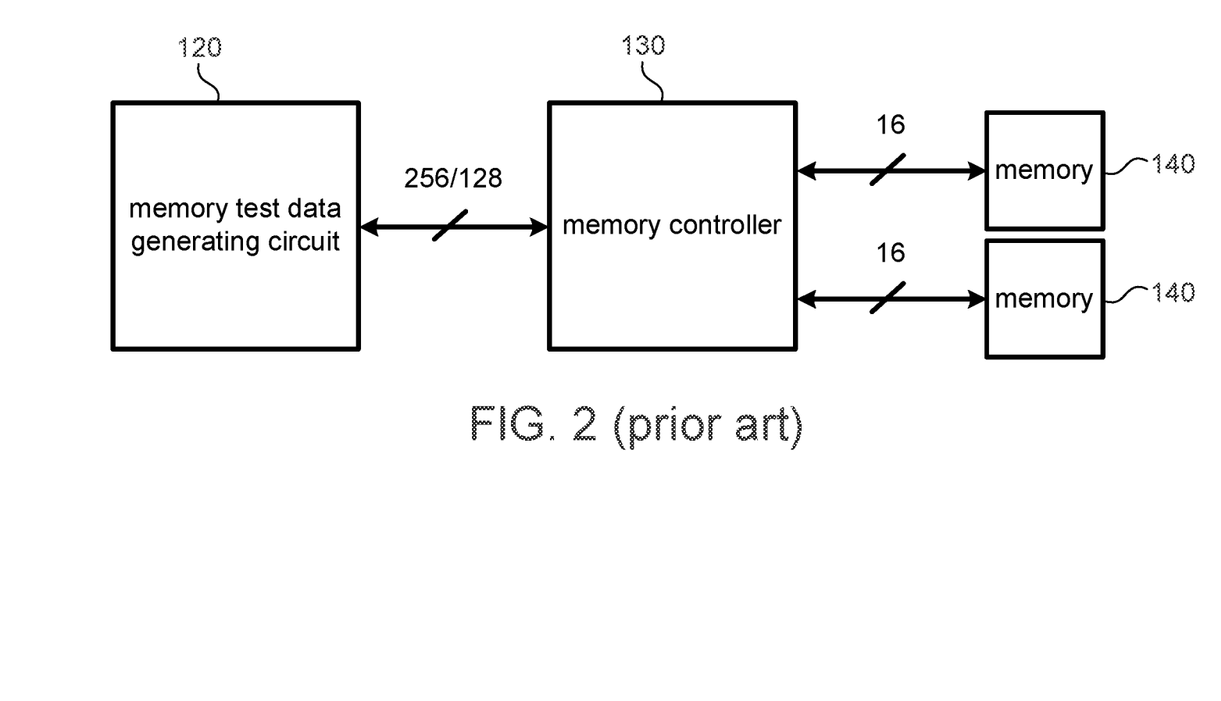
FIG. 2 is another function block diagram of a conventional memory test data generating circuit, a memory controller and memories.

The predetermined test data needs to be significantly representative in order to analyze the memory 140. However, as shown in FIG. 1, there are different data bus bit widths between the memory data test generating circuit 120 and the memory controller 130, e.g., 256 bits and 128 bits, and different data bus bit widths between the memory controller 130 and the memory 140, e.g., 16 bits and 8 bits. Further, as shown in FIG. 2, in a situation where one memory controller 130 is coupled to two memories 140, the data bus bit widths between the memory controller 130 and the memories 140 are 32 bits. Due to such multiple different combinations of data bus bit widths, it is challenging for the memory test data generating circuit 120 to verify the reliability of the memory 140 using the same worst noise mode at the memory 140, hence resulting in increased memory test complications.

SUMMARY OF THE INVENTION

The invention is directed to a memory test data generating circuit and method for simplifying the process for testing a memory.

The present invention discloses a memory test data generating circuit that generates a plurality of sets of test data. The plurality of sets of test data is provided to a memory via a plurality of channels by a memory controller to test the memory. The memory test data generating circuit includes: a plurality of counters, generating a plurality of counter values; and a data repetition and combination unit, generating the plurality of sets of test data according to the plurality of counter values, a bit width between the memory test data generating circuit and the memory controller, and a bit width between the memory controller and the memory. The test data of the channels is identical and periodical data series.

The present invention further discloses a memory test data generating method for generating a plurality of sets of test data. The plurality of sets of test data is provided to a memory via a plurality of channels by a memory controller to test the memory. The memory test data generating method includes: generating a plurality of counter values; and generating the plurality of sets of test data according to the plurality of counter values, a bit width that the memory controller uses to receive the plurality of sets of test data, and a bit width between the memory controller and the memory. The test data of the channels is identical and periodical data series.

In response to different data bus bit width combinations between the memory controller and the memory test data generating circuit as well as between the memories, the memory test data generating circuit and method of the present invention is capable of performing the test using memory test data formed by identical data series. Compared to the prior art, the present invention significantly reduces the complications of generating test data and enhances convenience and efficiency for testing the memory.

The above and other aspects of the invention will become better understood with regard to the following detailed description of the preferred but non-limiting embodiments. The following description is made with reference to the accompanying drawings.

DETAILED DESCRIPTION OF THE INVENTION

The disclosure of the application includes a memory test data generating circuit and method. In possible implementation, one skilled person in the art may choose equivalent elements or steps to implement the disclosure based on the disclosure of the application. That is, the implementation of the disclosure is not limited by the embodiments disclosed in the disclosure.

Figure 3:
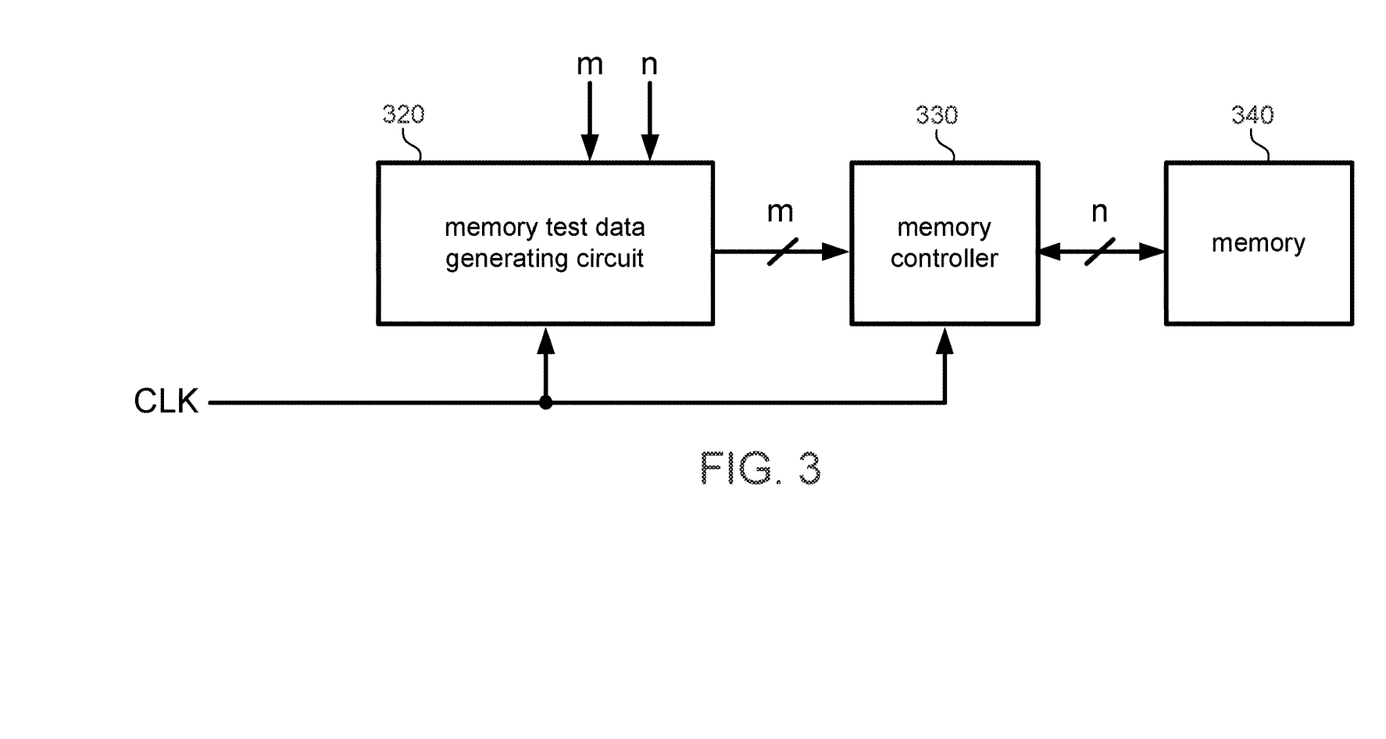
FIG. 3 is a schematic diagram of a connection relationship between a memory test data generating circuit and a memory controller according to an embodiment of the present invention.

FIG. 3 shows a diagram of a connection relationship between a memory test data generating circuit and a memory controller according to an embodiment of the present invention. In one embodiment, a memory test data generating circuit 320 may generate various types of noises, e.g., a worst noise. A data bus bit width between the memory test data generating circuit 320 and a memory controller 330 is m-bit, and a data bus bit width between the memory controller 330 and a memory 340 is n-bit, where m and n are both positive integers. More specifically, the n-bit data bus between the memory controller 330 and the memory 340 is usually divided into n/8 channels, i.e., the bit width of each channel is one byte. The memory test data generating circuit 320 generates a plurality of sets of test data according to two setting values, which are the data bus bit width between the memory controller 330 and the memory test data generating circuit 320 and the data bus bit width between the memory controller 330 and the memory 340. These two setting values may be represented by m and n, respectively, or by equivalent values, e.g., powers of 2. The test data generated by the memory test data generating circuit 320 is designed such a way that each channel includes identical data series after the access and conversion of the memory controller 330 according to the test data generated based on the values m and n, so as to facilitate the analysis of a test result of the memory 340. Thus, the memory test data generating circuit 320 is not required to design different noise generators in response to different data bus bit width combinations and different types of test data. Therefore, the present invention is capable of significantly reducing memory test complications. It should be noted that, the memory 340 may be formed by one single physical memory component or by more than two physical memory components, and has a total bit width of n bits. The memory test data generating circuit 320 and the memory controller 330 operate according to a clock CLK. Depending on a single data rate (SDR), a double data rate (DDR) or a higher data rate, the memory controller 330 may operate differently. Such details are generally known to one person skilled in the art, and shall be omitted herein.

Figure 4:
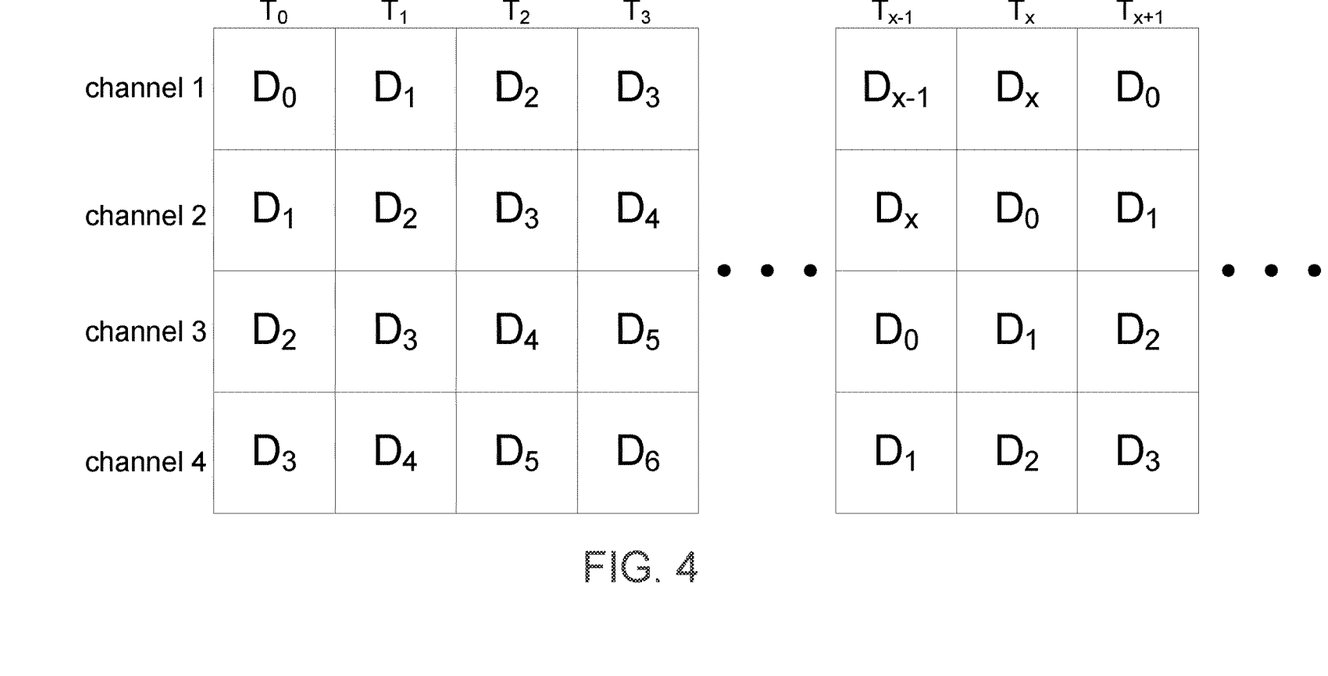
FIG. 4 is a schematic diagram of memory test data according to an embodiment of the present invention.

FIG. 4 shows a schematic diagram of memory test data according to an embodiment of the present invention. In FIG. 4, four channels represent data buses between the memory controller 330 and the memory 340. In this embodiment, n=32, meaning that the memory device coupled has a total bit width of 32 bits and the four channels in the embodiment also transmit test data. The channel 1 sequentially outputs data $D_0, D_1, D_2, \ldots, D_{x-1}, D_x, D_0, D_1 \ldots$ as the time increases (T0, T1, T2, ..., $T_{x-1}$, $T_x$, $T_{x+1}$, $T_{x+2}$ ...). The data series outputted by the channel 1 are periodical data series having a period Tx. The data represented by different denotations in the diagram may be identical or different. For example, $D_2$ may be identical to or different from $D_3$. In a preferred test operation, data having different denotations is different, i.e., $D_2$ is different from $D_3$. The data outputted by the channel 2, the channel 3 and the channel 4 is data series identical to the data series outputted by the channel 1, and also has the same period Tx. However, the data among the channels differ in time. For example, the channel 4 outputs the data $D_3$ at the time point $T_0$, and the same data $D_3$ is outputted at the time points $T_1$, $T_2$ and $T_3$ by the channels 3, 2 and 1, respectively. Thus, it may be regarded that, the data series of channel 4 is ahead of the data of the channel 3 by one clock period, the data series of the channel 4 is ahead of the data series of the channel 2 by two clock periods, and the data series of the channel 4 is ahead of the data of the channel 1 by three clock periods. Although the data series of each of the channels may be ahead or behind, it may be considered that the channels output identical contents, i.e., identical data series, over an extended period of time (i.e., when a large amount of data is outputted throughout the entire test period). When the data bus bit width of the memory 340 is 16-bit (i.e., n=16), any two of the four channels are selected; when the data bus bit width of the memory 340 is 8-bit, any one of the four channels is selected. That is to say, each channel is capable of performing independent test for a signal of a worst noise mode.

Figure 5:
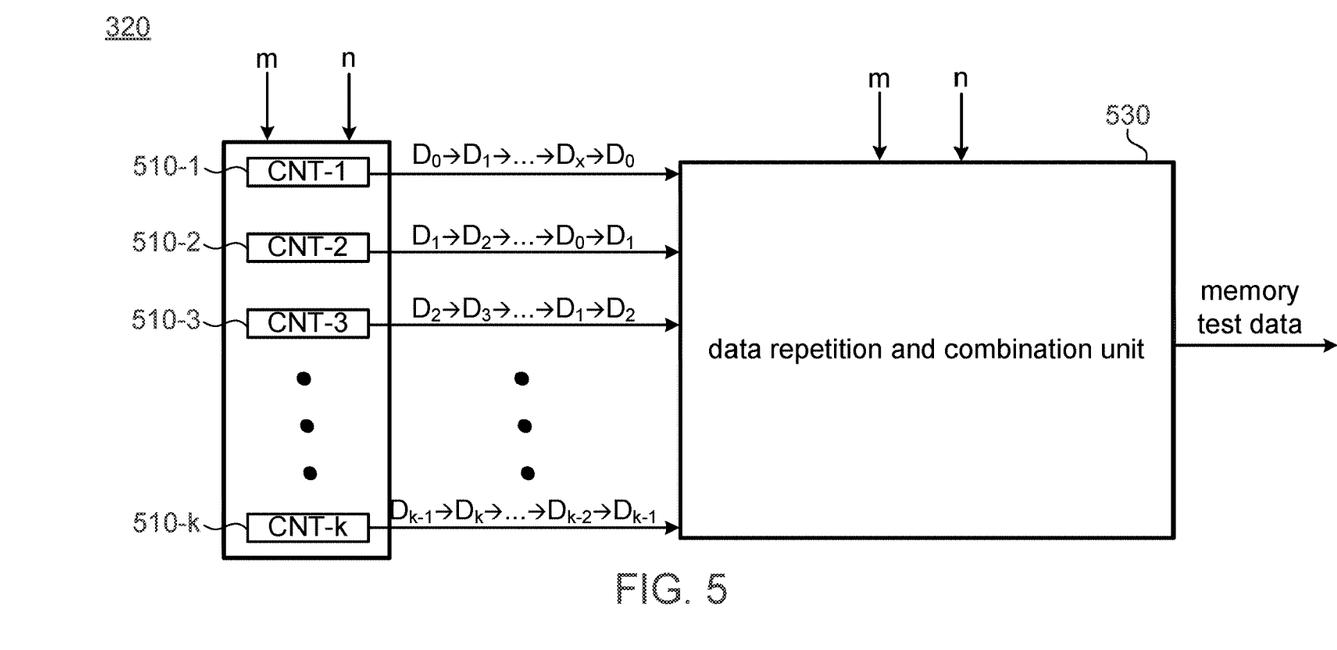
FIG. 5 is a circuit diagram of a memory test data generating circuit according to an embodiment of the present invention.
Figure 6A:
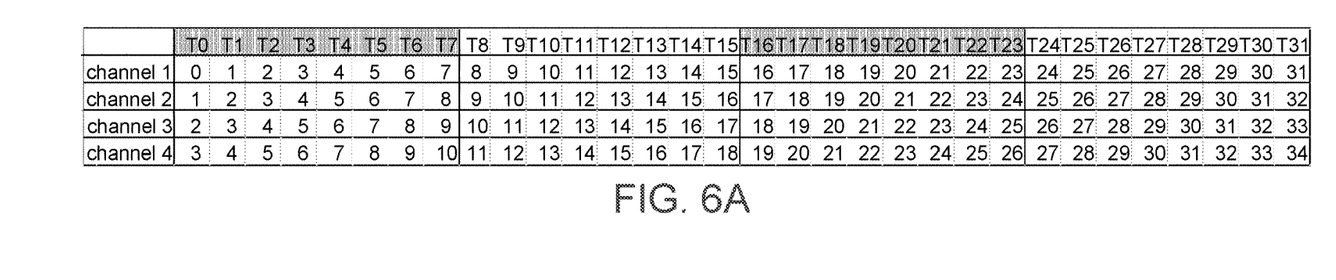
FIG. 6A to FIG. 6E are schematic diagrams of different data bus bit width combinations corresponding to memory test data according to an embodiment of the present invention.
Figure 6B:
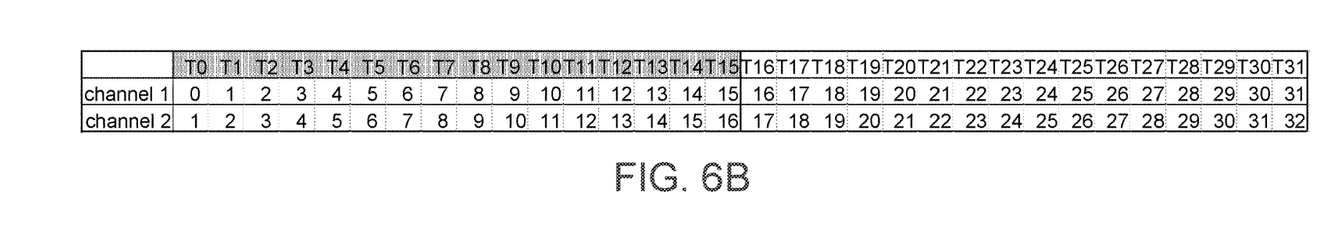
Figure 6C:
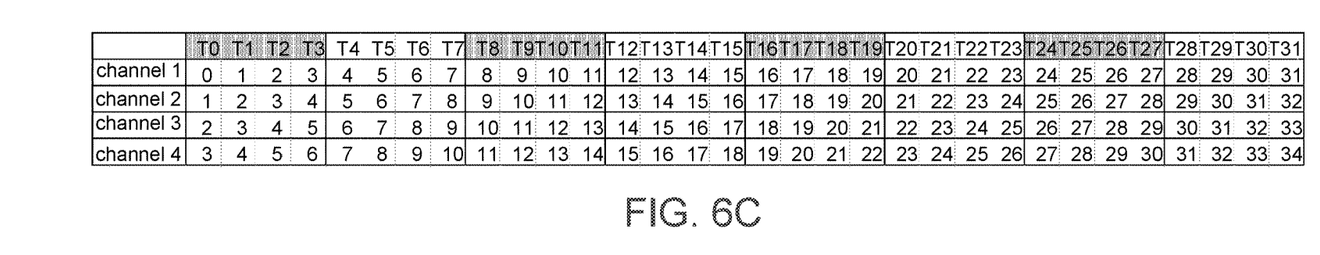
Figure 6D:
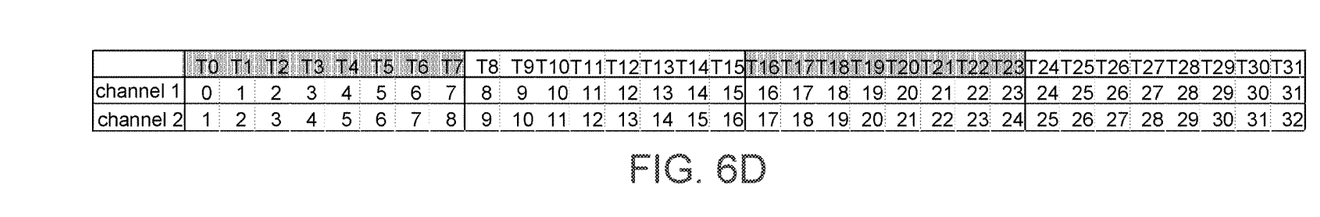
Figure 6E:
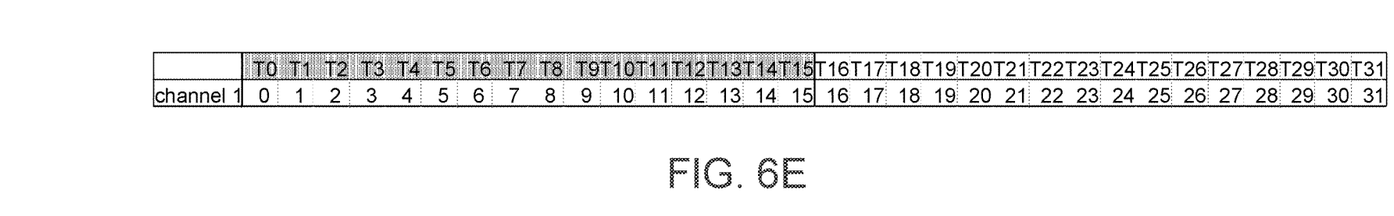

FIG. 5 shows a circuit diagram of a memory test data generating circuit according to an embodiment of the present invention. The memory test data generating circuit 320 includes k counters 510 and a data repetition and combination unit 530. Default values of all of the counters 510 form a continuous part of the data $D_0$ to $D_x$. For example, if k=10, the default values of the ten counters may be $D_0$ to $D_9$, or $D_1$ to $D_{10} \ldots$, and so forth. The counters 510 operate according to the clock CLK in FIG. 3, and generate counter values according to the sequence of the data series. That is to say, each of the counters 510 cyclically generates counter values according to the sequence $D_0 \rightarrow D_1 \rightarrow D_2 \rightarrow \ldots D_{x-1} \rightarrow D_x \rightarrow D_0 \rightarrow D_1 \rightarrow \ldots$. The data repetition and combination unit 530 selects required data according to the setting values m and n. The number of counters 510 may differ according to different bit width combinations (i.e., the combinations of m and n). Taking an SDR memory for example, the number of counters 510 required is: (m/n)+(n/8)−1. For example, when m=128 and n=16, the data of a total of nine counters 510 is selected by the data repetition and combination unit 530 and further combined into memory test data. The data repetition and combination unit 530 similarly operates according to the clock CLK. Taking an SDR memory for example, the data repetition and combination unit 530 generates the test memory data once every m/n period of the clock CLK. Detailed operations of memory test data combination of the data repetition and combination unit 530 are given below using different m/n combinations and simplified values.

FIG. 6A to FIG. 6E show schematic diagrams of different data bus bit width combinations corresponding to the memory test data according to an embodiment of the present invention. In the diagrams, each value represents data of one byte. In the example in FIG. 6A, m=256 and n=32. That is, the memory test data generating circuit 320 transmits 256-bit data to the memory controller 330 at the time point T0, and the memory controller 330 evenly outputs the 256-bit data at the time points T0 to T7. More specifically, the data repetition and combination unit 530 selects the values of a total of 11 counters 510 according to m/n=256/32 and the above equation, and these counters 510 output data 0 to 10 at the time point T0. Taking FIG. 6A for example, the data repetition and combination unit 530 receives the counter values of the counters 510-1 to 510-10, respectively being counter values 0 to 10, at the time point T0. The data repetition and combination unit 530 then combines and provides all output data (a total of 256 bits) of the channels 1 to 4 according to such data. For example, the output data is a bit-by-bit concatenation 0, 1, 2, 3, 1, 2, 3, 4, 2, 3, 4, 5, 3, 4, 5, 6, 4, 5, 6, 7, 5, 6, 7, 8, 6, 7, 8, 9, 7, 8, 9, 10. In the period from T1 to T7, the data repetition and combination unit 530 temporarily stops outputting the memory test data, with however the counter 510 continuing changing the counter values. Only at the time point T8 (which is m/n=256/32=8 periods from the time point T1), the data repetition and combination unit 530 combines, provides and outputs the memory test data according to the counter values (8 to 18) of these 11 counters 510. Again taking FIG. 6A for example, the data repetition and combination unit 530 receives the counter values of the counters 510-1 to 510-10 at the time point T8. At this point, after 8 clock periods, the counter values are 8 to 18, respectively, and the combined memory test data (a total of 256 bits) is a bit-by-bit concatenation 8, 9, 10, 11, 9, 10, 11, 12, 10, 11, 12, 13, 11, 12, 13, 14, 12, 13, 14, 15, 13, 14, 15, 16, 14, 15, 16, 17, 15, 16, 17, 18, for example. By repeating the above operations, the channels 1 to 4 respectively output periodical data, which has the same sequence but differs in time. It should be noted that, although only time points T0 to T31 are depicted in the diagram, more data is actually generated. Further, in this example, the data period is greater than 32 clock periods. FIG. 6B to FIG. 6E respectively illustrate situations where m/n=256/16, 128/32, 128/16 and 128/8. Associated operation principles are similar to those described above, and shall omitted herein. It is apparent that, each of the channels may be applied for independently testing a worst mode signal, and so that present invention is suitable for various m/n combinations. That is, the present invention is suitable for all kinds of combinations of data bus bit widths between the memory controller and the test data generating circuit as well as between memories to significantly reduce test complications.

Figure 7:
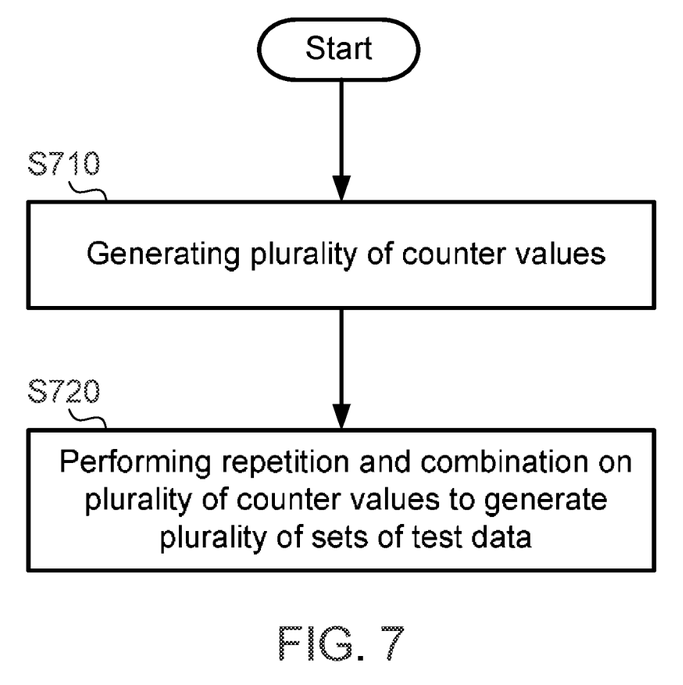
FIG. 7 is a flowchart of a memory test data generating method according to an embodiment of the present invention.

In addition to the foregoing memory test data generating circuit, the present invention correspondingly discloses a memory test data generating method. The method may be performed by the foregoing memory test data generating circuit or an equivalent circuit. The plurality of sets of memory test data accesses the memory via a plurality of channels by a memory controller to test the memory. The plurality of sets of memory data is transmitted to the memory controller by an m-bit data bus bit width, and the memory controller accesses the memory by an n-bit data bus bit width. As shown in FIG. 7, the memory test data generating method according to an embodiment of the present invention includes following steps.

In step S710, a plurality of counter values are generated.

In step S720, the counter values are repeated and combined according to the bit width that the memory controller uses to receive the test data and the bit width between the memory controller and the memory to generate the plurality of sets of test data. The memory test data may be combined and arranged according to the counter values generated by counters. Default values of the counters are determined according to the bit width that the memory controller uses to receive the test data and the bit width between the memory controller and the memory. The number of the counters is associated with the values m and n. In one embodiment, the clock of the counters is the same as the clock of the memory controller, and the required number of counters is (m/2)+(n+8)−1. Each of the counters changes the counter value in each clock period. In this step, the memory test data is generated once in every m/n clock period.

As shown in FIG. 4, the memory test data having passes through the memory controller is distributed on multiple channels, each of which capable of transmitting 8-bit data, and so the total number of channels used for accessing the memory is n/8. The data of each of the channels is periodical, and so it may be considered that the channels have memory test data having identical data series. Further, the data among the channels is delayed in time, i.e., the data among the channels has a time difference. It is seen from FIG. 4 that, each of the channels may be independently applied for testing a worst noise mode signal, and so it is not required to generate a plurality of test patterns in response to different m/n combinations. When the present invention is applied to a situation of one memory controller connected to two memories (as shown in FIG. 2), the two memories may use the same memory test data to perform tests, thereby simplifying comparison complexities of test results as well as enhancing the accuracy of memory verification.

An SDR memory is taken as an example in the above embodiments. However, one person skilled in the art can apply the present invention to situations where the memory controller 330 and the memory 340 operate at a DDR or at a higher rate based on the above disclosure. For example, when the present invention is applied to a DDR memory, more counters may be needed when test data is generated in order to simultaneously select more counters for satisfying requirements of a larger amount of memory test data.

One person skilled in the art can understand implementation details and variations of the method in FIG. 7 based on the disclosure of the circuit in FIG. 3 and FIG. 5. Further, while the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory test data generating circuit, generating a plurality of sets of test data, the plurality of sets of test data provided to a memory via a plurality of channels by a memory controller to test the memory, the memory test data generating circuit comprising:
    a plurality of counters, generating a plurality of counter values; and
    a data repetition and combination unit, generating the plurality of sets of test data according to the plurality of counter values, a bit width between the memory test data generating circuit and the memory controller, and a bit width between the memory controller and the memory;
    wherein, the test data of the channels is periodical identical data series.

2. The memory test data generating circuit according to claim 1, wherein the test data of different channels comprises the identical data series with a time difference.

3. The memory test data generating circuit according to claim 1, wherein the test data of each of the channels corresponds to a worst noise mode.

4. The memory test data generating circuit according to claim 1, wherein default values of the counters are determined according to the bit width between the memory test data generating circuit and the memory controller and the bit width between the memory controller and the memory.

5. The memory test data generating circuit according to claim 1, wherein the data repetition and combination unit selects a plurality of counter values corresponding to the plurality of counters according to the bit width between the memory test data generating circuit and the memory controller and the bit width between the memory controller and the memory to generate the plurality of sets of test data.

6. The memory test data generating circuit according to claim 1, wherein the data repetition and combination unit selects $(m/n)+(n/8)-1$ counter values of the plurality of counters as the plurality of sets of test data, where m represents the bit width between the memory test data generating circuit and the memory controller and n represents the bit width between the memory controller and the memory.

7. The memory test data generating circuit according to claim 1, wherein the memory controller operates according to a clock, and the counter counts according to the clock.

8. The memory test data generating circuit according to claim 7, wherein the data repetition and combination unit captures the plurality of counter values from the plurality of counters once every m/n period of the clock, where m represents the bit width between the memory test data generating circuit and the memory controller, and n represents the bit width between the memory controller and the memory.

9. The memory test data generating circuit according to claim 7, wherein the data repetition and combination unit outputs the plurality of sets of test data once every m/n period of the clock, where m represents the bit width between the memory test data generating circuit and the memory controller and n represents the bit width between the memory controller and the memory.

10. A memory test data generating method, for generating a plurality of sets of test data, the plurality of sets of test data provided to a memory via a plurality of channels by a memory controller to test the memory, the memory test data generating method comprising:
generating a plurality of counter values; and
generating the plurality of sets of test data according to the plurality of counter values, a bit width that the memory controllers uses to receive the plurality of sets of test data, and a bit width between the memory controller and the memory;
wherein, the test data of the channels is periodical identical data series.

11. The memory test data generating method according to claim 10, wherein the test data of different channels comprises the identical data series with a time difference.

12. The memory test data generating method according to claim 10, wherein the test data of each of the channels corresponds to a worst noise mode.

13. The memory test data generating method according to claim 10, wherein the step of generating the plurality of counter values generates the plurality of counter values by a plurality of counters.

14. The memory test data generating method according to claim 13, wherein default values of the counters are determined according to the bit width that the memory controller uses to receive the plurality of sets of test data and the bit width between the memory controller and the memory.

15. The memory test data generating method according to claim 13, wherein the step of generating the plurality of sets of test data comprises:
selecting a plurality of counter values of the plurality of counters according to the bit width that the memory controller uses to receive the plurality of sets of test data and the bit width between the memory controller and the memory to generate the plurality of sets of test data.

16. The memory test data generating method according to claim 13, wherein the number of the counters is $(m/n)+(n/8)-1$, where m represents the bit width that the memory controller uses to receive the plurality of sets of test data, and n represents the bit width between the memory controller and the memory.

17. The memory test data generating method according to claim 10, wherein the memory controller operates according to a clock, and the counter counts according to the clock.

18. The memory test data generating method according to claim 17, wherein the step of generating the plurality of sets of test data generates the plurality of test data once every m/n period of the clock, where m represents the bit width that the memory controller uses to receive the plurality of sets of test data, and n represents the bit width between the memory controller and the memory.

* * * * *